United States Patent
Kim

(10) Patent No.: US 10,439,019 B2
(45) Date of Patent: Oct. 8, 2019

(54) COIL COMPONENT

(71) Applicant: SAMSUNG ELECTRO-MECHANICS CO., LTD., Suwon-si, Gyeonggi-do (KR)

(72) Inventor: Young Sin Kim, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 185 days.

(21) Appl. No.: 15/616,142

(22) Filed: Jun. 7, 2017

(65) Prior Publication Data

US 2018/0158896 A1 Jun. 7, 2018

(30) Foreign Application Priority Data

Dec. 5, 2016 (KR) .................. 10-2016-0164508

(51) Int. Cl.
| | |
|---|---|
| *H01F 5/00* | (2006.01) |
| *H01L 49/02* | (2006.01) |
| *H01F 17/00* | (2006.01) |
| *H01F 5/06* | (2006.01) |
| *H01F 17/04* | (2006.01) |
| H01F 41/04 | (2006.01) |

(52) U.S. Cl.
CPC .............. *H01L 28/10* (2013.01); *H01F 5/00* (2013.01); *H01F 5/06* (2013.01); *H01F 17/0013* (2013.01); *H01F 17/04* (2013.01); H01F 41/04 (2013.01)

(58) Field of Classification Search
CPC .......................... H01F 5/00; H01F 27/00–36

USPC ................ 336/65, 83, 178, 192, 200, 232
See application file for complete search history.

(56) References Cited

U.S. PATENT DOCUMENTS

| | | | | |
|---|---|---|---|---|
| 6,504,463 | B1 * | 1/2003 | Kato ..................... | H01F 27/027 336/192 |
| 7,026,903 | B2 * | 4/2006 | Hsu ........................ | H01F 17/043 336/200 |
| 2002/0017972 | A1 * | 2/2002 | Hsu ........................ | H01F 17/043 336/96 |
| 2002/0158739 | A1 | 10/2002 | Shibata et al. | |
| 2006/0022788 | A1 * | 2/2006 | Sasamori .............. | H01F 17/043 336/208 |
| 2006/0103262 | A1 * | 5/2006 | Sano ..................... | H01F 27/027 310/263 |
| 2007/0216512 | A1 * | 9/2007 | Sano ..................... | H01F 17/043 336/212 |

(Continued)

FOREIGN PATENT DOCUMENTS

| | | |
|---|---|---|
| JP | 2002-324714 A | 11/2002 |
| JP | 2006-286658 A | 10/2006 |
| JP | 2009-260116 A | 11/2009 |

(Continued)

*Primary Examiner* — Tuyen T Nguyen
(74) *Attorney, Agent, or Firm* — Morgan, Lewis & Bockius LLP

(57) ABSTRACT

A coil component includes a first core including a support portion, a core portion protruding from the support portion, and a sidewall portion protruding from the support portion and partially surrounding the core portion, the sidewall portion including first and second sidewalls connected to each other, and surfaces of the first core opposing the first and second sidewalls being open, a winding-type coil disposed on the first core, and a second core attached to the first core.

18 Claims, 4 Drawing Sheets

(56) References Cited

U.S. PATENT DOCUMENTS

2008/0231406 A1* 9/2008 Lin ...................... H01F 27/292
                                                    336/200
2010/0328003 A1   12/2010 Shibuya et al.

FOREIGN PATENT DOCUMENTS

KR   10-1536376 B1   7/2015
WO   2010/042308 A1   4/2010

* cited by examiner

COIL COMPONENT

CROSS-REFERENCE TO RELATED APPLICATION(S)

This application claims benefit of priority to Korean Patent Application No. 10-2016-0164508, filed on Dec. 5, 2016 with the Korean Intellectual Property Office, the disclosure of which is incorporated herein by reference in its entirety.

TECHNICAL FIELD

The present disclosure relates to a coil component such as a power inductor.

BACKGROUND

A power inductor requires a structure capable of implementing as high a degree of performance as possible while having as small of a size as possible and implementing high reliability.

Particularly, demand for medium and large power inductors is not limited to household appliances and office machines, but has increased in the industrial and vehicle electric component fields. Therefore, medium and large power inductors have been required to have higher reliability than small power inductors.

However, in an existing plating method used in the small power inductor, it is difficult to secure reliability against vibrations, impacts, or the like, such that there is a limitation in ensuring reliability.

SUMMARY

An aspect of the present disclosure may provide a coil component capable of being used as medium and large power inductors by having excellent performance and high reliability.

According to an aspect of the present disclosure, a coil component manufactured by a core method of disposing a winding type coil on a core having sidewalls approximately perpendicular to each other and having a structure in which surfaces opposing the sidewalls are open may be provided.

According to an aspect of the present disclosure, a coil component includes a first core including a support portion, a core portion protruding from the support portion, and a sidewall portion protruding from the support portion and partially surrounding the core portion, the sidewall portion including first and second sidewalls connected to each other, and surfaces of the first core opposing the first and second sidewalls being open, a winding-type coil disposed on the first core, and a second core attached to the first core.

According to another aspect of the present disclosure, a coil component includes a first core having two open surfaces adjacent each other and two closed surfaces adjacent each other, the respective open surfaces opposing the respective closed surfaces, a coil disposed on the first core and formed as a winding type coil, and a second core attached to the first core.

According to other aspects of the present disclosure, a coil component includes a first core including an arcuate channel and a support portion, a core portion protruding from the support portion, and a sidewall portion protruding from the support portion and partially surrounding the core portion, the sidewall portion including first and second sidewalls connected to each other, and surfaces of the first core opposing the first and second sidewalls being open, a winding-type coil disposed on the first core and at least partially disposed within the arcuate channel, and a second core attached to the first core.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
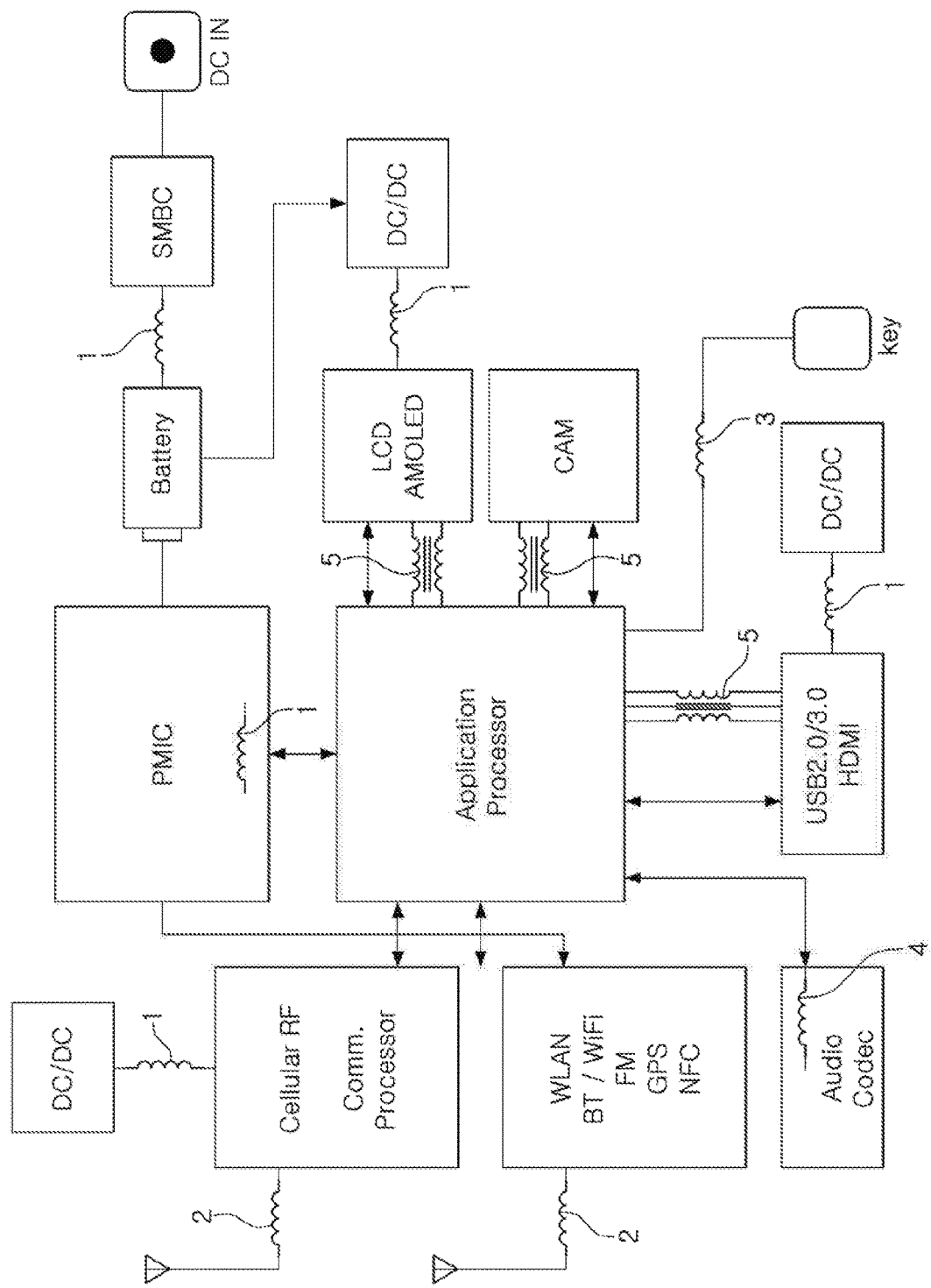
FIG. 1 is a schematic view illustrating an example of a coil component used in an electronic device according to exemplary embodiments of the present disclosure.

Hereinafter, exemplary embodiments in the present disclosure will be described in more detail with reference to the accompanying drawings. In the drawings, shapes, sizes, and the like, of components may be exaggerated for clarity.

Meanwhile, in the present disclosure, the meaning of an "electrical connection" of one component to another component includes a case in which one component is physically connected to another component and a case in which one component is not physically connected to another component. It can be understood that when an element is referred to with "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

In addition, a term "example" used in the present disclosure does not necessarily mean the same exemplary embodiment, but is provided in order to emphasize and describe different unique features. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

In addition, terms used in the present disclosure are used only in order to describe an example rather than limiting the scope of the present disclosure. In this case, singular forms include plural forms unless interpreted otherwise in context.

Electronic Device

FIG. 1 is a schematic view illustrating an example of a coil component used in an electronic device according to exemplary embodiments of the present disclosure.

Referring to FIG. 1, it may be appreciated that various kinds of electronic components are used in an electronic device. For example, an application processor, a direct current (DC) to DC converter, a communications processor, a wireless local area network Bluetooth (WLAN BT)/wireless fidelity frequency modulation global positioning system near field communications (WiFi FM GPS NFC), a power management integrated circuit (PMIC), a battery, an SMBC, a liquid crystal display active matrix organic light emitting diode (LCD AMOLED), an audio codec, a universal serial bus (USB) 2.0/3.0 a high definition multimedia interface (HDMI), a CAM, and the like, may be used. In exemplary cases, various kinds of coil components may be appropriately used between these electronic components depending on their purposes in order to remove noise, or the like. For example, a power inductor 1, high frequency (HF) inductors 2, a general bead 3, a bead 4 for a high frequency (GHz), common mode filters 5, and the like, may be used.

In detail, the power inductor 1 may be used to store electricity in a magnetic field form to maintain an output voltage, thereby stabilizing power. In addition, the high frequency (HF) inductor 2 may be used to perform impedance matching to secure a required frequency or cut off noise and an alternating current (AC) component. Further, the general bead 3 may be used to remove noise of power and signal lines or remove a high frequency ripple. Further, the bead 4 for a high frequency (GHz) may be used to remove high frequency noise of a signal line and a power line related to an audio signal. Further, the common mode filter 5 may be used to pass a current therethrough in a differential mode and remove only common mode noise.

The electronic device may be a smartphone, a personal digital assistant (PDA), a digital video camera, a digital still camera, a network system, a computer, a monitor, a television, a video game machine, a smartwatch, an automotive component, or the like.

Coil Component

Hereinafter, a coil component according to the present disclosure, particularly a power inductor, will be described for convenience of explanation. However, the coil component according to the present disclosure may also be applied as the coil components for various purposes as described above.

Meanwhile, hereinafter, a side portion refers to a portion in a first direction or a second direction for convenience, an upper portion refers to a portion in a third direction for convenience, and a lower portion refers to a portion in an opposite direction to the third direction for convenience. In addition, a phrase "positioned at the side portion, the upper portion, or the lower portion" includes a case in which a target component is positioned in a corresponding direction, but does not directly contact a reference component, as well as a case in which the target component directly contacts the reference component in the corresponding direction. However, these directions are defined for convenience of explanation, and the claims are not particularly limited by the directions defined as described above.

Figure 2:
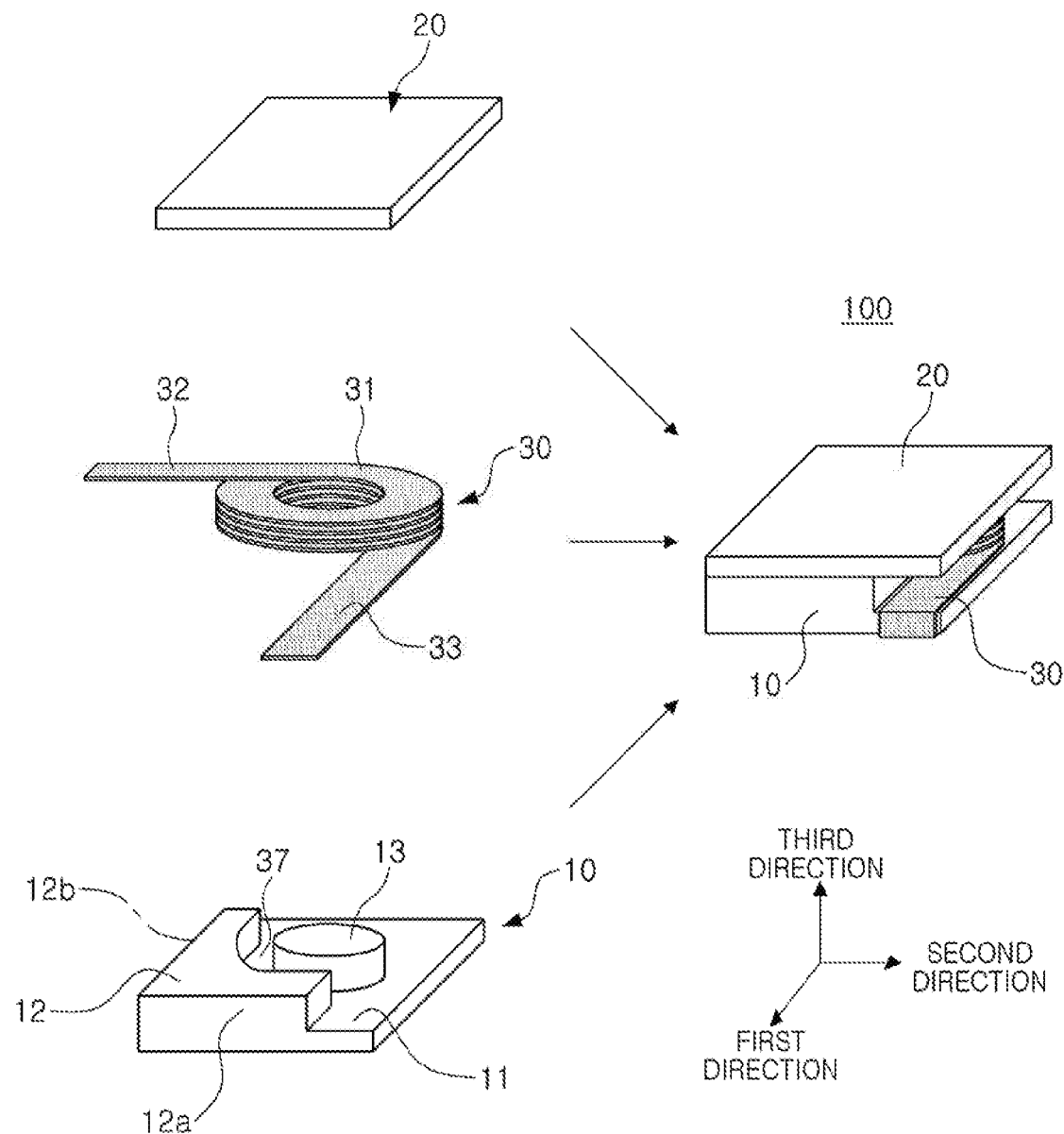
FIG. 2 is a schematic exploded perspective view illustrating an example of a coil component according to exemplary embodiments of the present disclosure.

FIG. 2 is a schematic exploded perspective view illustrating an example of a coil component according to an exemplary embodiment of the present disclosure.

Referring to FIG. 2, a coil component 100 according to an exemplary embodiment in the present disclosure may include a first core 10 including a support portion 11, a core portion 13 protruding from the support portion 11, and a sidewall portion 12 protruding from the support portion 11 and partially surrounding the core portion 13, a coil 30 disposed on the first core 10 and formed as a winding type, and a second core 20 attached to the first core 10. The sidewall portion 12 of the first core 10 may include first and second sidewalls 12a and 12b connected to each other. Surfaces of the first core 10 opposing the first and second sidewalls 12a and 12b may be open. Outer surfaces of the first and second sidewalls 12a and 12b may be perpendicular to each other. That is, the first core 10 may have two open surfaces adjacent each other and two closed surfaces adjacent each other, and the respective open surfaces and the respective closed surfaces may oppose each other. In more detail, the two open surfaces may be vertically adjacent each other, and the two closed surfaces may be vertically adjacent each other. For example, the first core 10 may be an approximately F-shaped core. Meanwhile, a term 'vertical' is a concept including a case in which an angle is approximately 90° as well as a case in which an angle is exactly 90°.

Meanwhile, performance of the coil component such as the power inductor is most closely associated with forming a magnetic path in which a magnetic flux flows at a maximum area and the shortest distance. However, the power inductor has been generally manufactured by a method of putting a wound coil in a magnetic material. In such a method, in-out areas of a magnetic path are unbalanced or materials having different magnetic permeabilities are used together with each other, such that the power inductor may not function properly.

On the other hand, in the coil component 100, the first core 10 that may be formed of the magnetic material in which the coil 30 is disposed may be configured to have the two closed surfaces and the two open surfaces to significantly increase areas of closed loops in and out which a magnetic flux comes and goes and maintains a balance between the in-out areas of the magnetic path. That is, the sidewall portion 12 may be formed on only one side in an approximately "L" shape to significantly increase an area of the core portion 13, resulting in a significant increase in the areas of the closed loops to be balanced. Therefore, performance of the coil component may be significantly improved. The first core 10 may be manufactured by molding the magnetic material at a high pressure. In this case, a density and a magnetic permeability of the magnetic material may rise, and performance of the coil component 100 may be improved.

Meanwhile, the second core 20 may have a flat plate shape. For example, the second core 20 may be an approximately I-shaped core. The second core 20 may be attached to the first core 10 to cover an upper portion of the coil 30. The second core 20 may be manufactured by molding a magnetic material at a high pressure. Therefore, a density and a magnetic permeability of the magnetic material may rise to further improve the performance of the coil component 100. The second core 20 may be attached to the first core 10 with an adhesive, such that reliability may be improved. A component of the adhesive is not particularly limited. Since the second core 20 is attached to the first core 10, the coil component 100 according to the exemplary embodiment may be an approximately FI core.

Meanwhile, magnetic powder particles of the first core 10 and the second core 20 may be magnetic metal powder particles, and the magnetic metal powder particles may include, for example, Fe, Cr, and/or Si as main components. In more detail, the magnetic metal powder particles may include Fe—Ni, amorphous Fe, Fe, Fe—Cr—Sr, and the like, but are not limited thereto. The first core 10 and the second core 20 may be formed of a magnetic material-resin composite in which magnetic metal powder particles and a resin mixture are mixed with each other as well as the magnetic metal powder particles. The resin mixture may be, for example, epoxy, polyimide, liquid crystal polymer (LCP), or the like, but is not limited thereto. Meanwhile, magnetic metal powder particles having different sizes may be used and pressed, such that a packing factor may be further increased. For example, coarse powder particles and fine powder particles including Fe, Cr, and Si as main components may be used as the magnetic metal powder particles, and an epoxy-based resin may be used as the resin mixture. However, the magnetic metal powder particles and the resin mixture are not limited thereto.

Meanwhile, the coil 30 may be a winding coil formed by a winding method, and may include a conductive material such as copper (Cu), or the like. For example, the coil 30 may be made from copper Cu by the winding method, and may be plated with nickel (Ni) and/or tin (Sn), but is not limited thereto.

Figure 3:
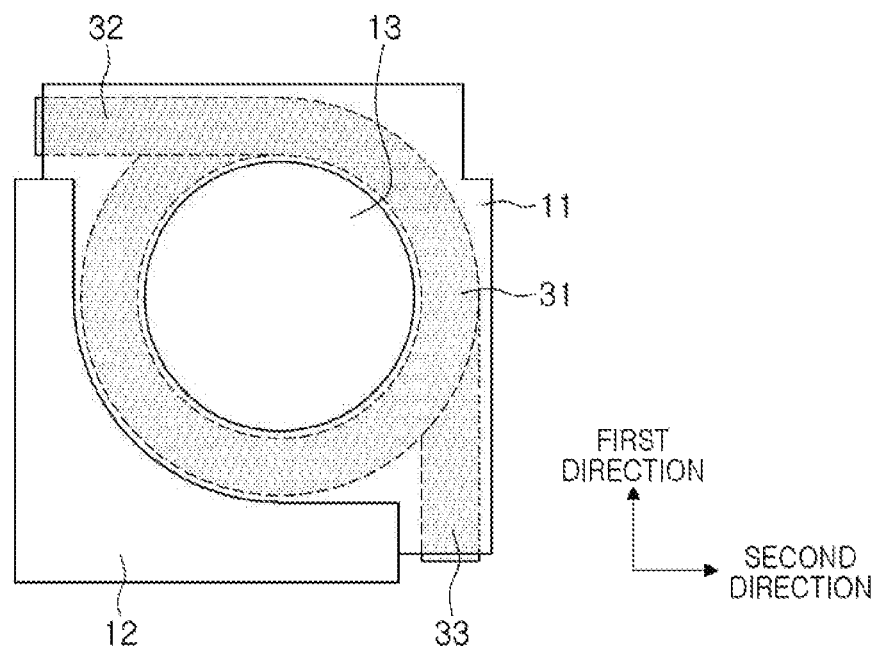
FIG. 3 is a schematic plan view illustrating a first core and a coil disposed on the first core in the coil component of FIG. 2 when viewed from above.

FIG. 3 is a schematic plan view illustrating a first core and a coil disposed on the first core in the coil component of FIG. 2 when viewed from above.

Figure 4:
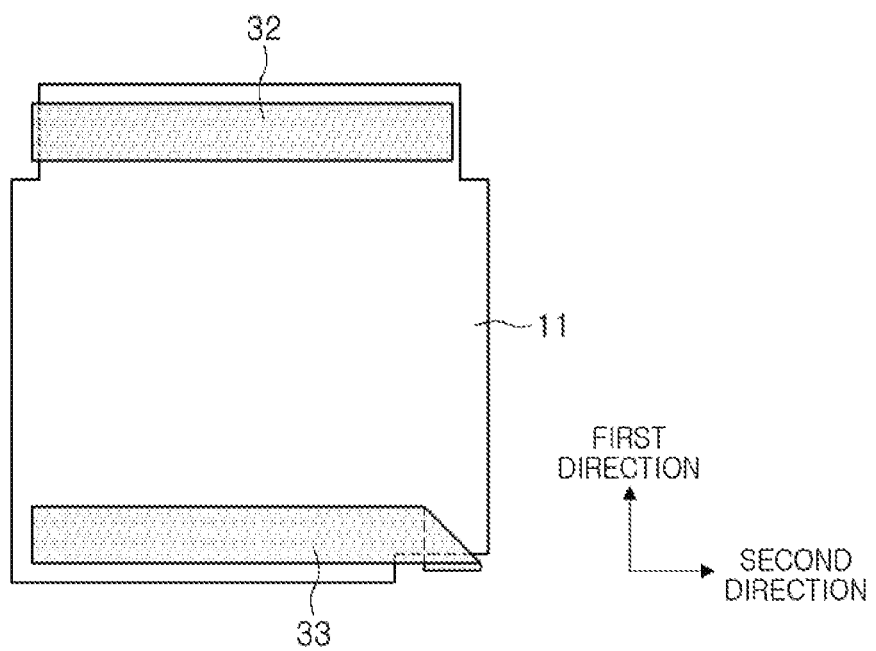
FIG. 4 is a schematic plan view illustrating a first core and a coil disposed on the first core in the coil component of FIG. 2 when viewed from below.

FIG. 4 is a schematic plan view illustrating a first core and a coil disposed on the first core in the coil component of FIG. 2 when viewed from below.

Referring to the drawings, the coil 30 may include a winding portion 31 of which the center is coupled to the core portion 13 of the first core 10 and first and second lead portions 32 and 33 are led from, or extend from, the winding portion 31 in different directions on the support portion 11 of the first core 10. Further, the first core 10 may include an arcuate channel 37 and at least a portion of the winding portion 31 may be disposed within the arcuate channel 37. In this case, the first and second lead portions 32 and 33 may be led from the winding portion 31 in directions perpendicular to each other on the support portion 11 of the first core 10. In addition, the first and second lead portions 32 and 33 may be folded downwardly of the support portion 11 of the first core 10. Resultantly, the first and second lead portions 32 and 33 may be parallel with each other below the support portion 11 when folded, as described. Meanwhile, a term 'vertical' is a concept including a case in which an angle is approximately 90° as well as a case in which an angle is exactly 90°. In addition, a term 'parallel' is a concept including a case in which an angle is approximately 0° or 180° as well as a case in which an angle is exactly 0° or 180°.

A coil component, such as medium and large power inductors has generally adopted a method of bonding and molding a core portion and a lead frame of the inductor to each other. However, in this case, stress may occur in a process of plating or welding an electrode, resulting in a decrease in reliability.

However, in the coil component 100 according to exemplary embodiments of the present disclosure, the wound coil 30 may be assembled in an approximately "⌐" shape to the first core 10 to externally protrude the first and second lead portions 32 and 33 downwardly of the support portion 11 of the first core 10 in a diagonal structure of the coil component 100, resulting in completion of an external electrode having an approximately "1" shape without using the lead frame. Therefore, the coil component 100 may have excellent reliability against physical stress that may be problematic in the process of plating or welding the electrode as described above.

Figure 5:
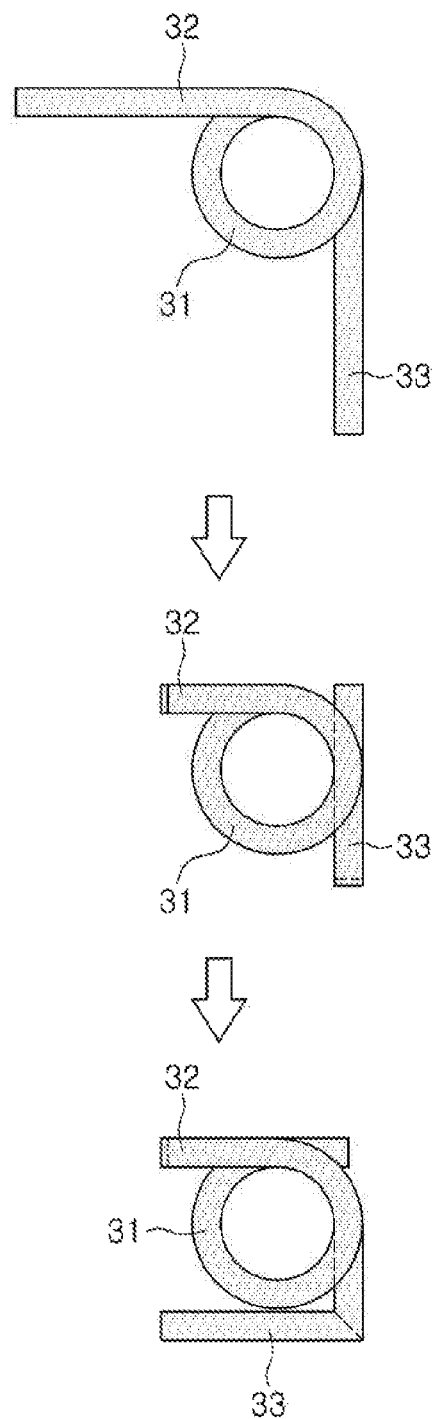
FIG. 5 illustrates a process of forming the coil of the coil component of FIG. 2.

FIG. 5 illustrates a process of forming the coil of the coil component of FIG. 2.

Referring to FIG. 5, the first lead portion 32 of the coil 30 may be folded once downwardly of the support portion 11 of the first core 10 in parallel in an opposite direction to a direction in which the first lead portion 32 is led, or extends, from the winding portion 31. In addition, the second lead portion 33 of the coil 30 may be folded once downwardly of the support portion 11 of the first core 10 in a direction parallel with a direction in which the second lead portion 33 is led, or extends, from the winding portion 31 and may then be folded again perpendicular to a direction in which the second lead portion 33 is led, or extends, from the winding portion 31 in an opposite direction to the first lead portion 32 after the first lead portion 32 has been folded as described above.

The coil 30 may have the disposition as described above through such a forming process. Meanwhile, a term 'vertical' is a concept including a case in which an angle is approximately 90° as well as a case in which an angle is exactly 90°. In addition, a term 'parallel' is a concept including a case in which an angle is approximately 0° or 180° as well as a case in which an angle is exactly 0° or 180°.

Meanwhile, the coil component 100 according to exemplary embodiments of the present disclosure may be manufactured through, for example, the following processes. First, the first core 10, the second core 20, and the coil 30 may be individually prepared. The first core 10 and the second core 20 may be manufactured by molding a material including magnetic powder particles at a high pressure using a press to form the above-mentioned structure and then hardening and sintering the material. An edgewise wound flat wire, or the like, may be used as the coil 30. Then, the coil 30 may be attached to the first core 10, as described above. Then, the second core 20 may be attached to the first core 10 using an adhesive, or the like. Then, the lead portions 32 and 33 of the coil 30 may be formed as described above. A final product may be completed through post-processes such as a marking process, an inspecting process, a packaging process, and the like.

As set forth above, according to exemplary embodiments of the present disclosure, a coil component capable of being used as medium and large power inductors and having excellent performance and high reliability may be provided.

While exemplary embodiments have been shown and described above, it will be apparent to those skilled in the art that modifications and variations could be made without departing from the scope of the present disclosure as defined by the appended claims.

What is claimed is:

1. A coil component, comprising:
   a first core including a support portion, a core portion protruding from the support portion, and a sidewall portion protruding from the support portion and partially surrounding the core portion, the sidewall portion including first and second sidewalls connected to each other along a first edge aligned to a first corner of the support portion;
   a winding-type coil disposed on the first core; and
   a second core attached to the first core,
   wherein an opening is provided between the first and second cores along a second edge aligned to a second corner of the support portion opposite to the first corner of the support portion.

2. The coil component of claim 1, wherein outer surfaces of the first and second sidewalls are perpendicular to each other.

3. The coil component of claim 1, wherein the coil includes a winding portion, a center of which is coupled to the core portion and first and second lead portions extend from the winding portion in different directions on the support portion.

4. The coil component of claim 3, wherein the first and second lead portions extend from the winding portion in directions perpendicular to each other on the support portion.

5. The coil component of claim 4, wherein the first and second lead portions are folded downwardly of the support portion, respectively.

6. The coil component of claim 5, wherein the first lead portion is folded once downwardly from the support portion in parallel with a direction in which the first lead portion extends in an opposite direction to the direction in which the first lead portion extends, and
the second lead portion is folded once downwardly of the support portion in a direction parallel with a direction in which the second lead portion extends in an opposite direction to the direction in which the second lead portion extends, and is folded once more in perpendicular to a direction in which the second lead portion extends.

7. The coil component of claim 5, wherein the first and second lead portions are parallel with each other below the support portion.

8. The coil component of claim 1, wherein the second core has a flat plate shape.

9. The coil component of claim 8, wherein the second core is attached to the first core with an adhesive.

10. The coil component of claim 1, wherein the first and second cores include magnetic powder particles.

11. A coil component, comprising:
a first core having a support portion, having a main planar surface and side surfaces connected to the main planar surface, and a sidewall portion extending from the main planar surface of the support portion along only two side surfaces adjacent each other from among the side surfaces;
a coil disposed on the first core and having a winding shape; and
a second core attached to the sidewall portion of the first core,
wherein the coil component includes an opening, between the second core and the support portion of the first core, co-planar with two other adjacent side surfaces of the support portion other than the two side surfaces having the sidewall portion.

12. The coil component of claim 11, wherein the two side surfaces having the sidewall portion are adjacent each other.

13. The coil component of claim 11, wherein first and second lead portions extend from the coil in directions perpendicular to each other on the support portion.

14. A coil component, comprising:
a first core including an arcuate channel and a support portion, a core portion protruding from the support portion, and a sidewall portion protruding from the support portion and partially surrounding the core portion, the sidewall portion including first and second sidewalls connected to each other;
a winding-type coil disposed on the first core and at least partially disposed within the arcuate channel; and
a second core attached to the first core,
wherein the winding-type coil is disposed between the second core and the support portion of the first core,
the winding-type coil has first and second lead portions extending outwardly, and
one sidewall of the winding-type coil between the first and second lead portions is externally exposed through an opening between the first and second cores.

15. The coil component of claim 14, wherein outer surfaces of the first and second sidewalls are perpendicular to each other.

16. The coil component of claim 14, wherein the coil includes a winding portion, a center of which is coupled to the core portion and the first and second lead portions extend from the winding portion in different directions on the support portion.

17. The coil component of claim 14, wherein the sidewall portion of the first core, including the first and second sidewalls connected to each other, is disposed between the first and second lead portions such that another sidewall of the winding-type coil between the first and second lead portions faces the sidewall portion.

18. The coil component of claim 14, wherein the one sidewall of the winding-type coil is uninterruptedly externally exposed from the first lead portion to the second lead portion through the opening between the first and second cores.

* * * * *